US012196802B2

(12) United States Patent
Shirasaki et al.

(10) Patent No.: US 12,196,802 B2
(45) Date of Patent: Jan. 14, 2025

(54) SEMICONDUCTOR INSPECTION DEVICE AND METHOD FOR INSPECTING SEMICONDUCTOR SAMPLE

(71) Applicant: Hitachi High-Tech Corporation, Tokyo (JP)

(72) Inventors: Yasuhiro Shirasaki, Tokyo (JP); Natsuki Tsuno, Tokyo (JP); Minami Shouji, Tokyo (JP); Makoto Sakakibara, Tokyo (JP); Satoshi Takada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 181 days.

(21) Appl. No.: 18/016,882

(22) PCT Filed: Sep. 29, 2020

(86) PCT No.: PCT/JP2020/036927
§ 371 (c)(1),
(2) Date: Jan. 19, 2023

(87) PCT Pub. No.: WO2022/070258
PCT Pub. Date: Apr. 7, 2022

(65) Prior Publication Data
US 2023/0273253 A1 Aug. 31, 2023

(51) Int. Cl.
*G01R 31/265* (2006.01)
*G01R 31/26* (2020.01)
(Continued)

(52) U.S. Cl.
CPC ......... *G01R 31/2653* (2013.01); *G01R 31/26* (2013.01); *G01R 31/2851* (2013.01); *G01R 31/28* (2013.01); *G01R 31/307* (2013.01)

(58) Field of Classification Search
CPC ...... G01R 31/00; G01R 31/26; G01R 31/265; G01R 31/2653; G01R 31/28;
(Continued)

(56) References Cited

U.S. PATENT DOCUMENTS 5,589,780 A * 12/1996 Ueda ................... G01R 31/307
250/311
6,559,662 B1 * 5/2003 Yamada ............... G01R 31/311
850/10
(Continued)

FOREIGN PATENT DOCUMENTS

JP 04-064245 A 2/1992
JP 11-330178 A 11/1999
(Continued)

OTHER PUBLICATIONS

International Search Report of PCT/JP2020/036927 dated Dec. 8, 2020.
(Continued)

*Primary Examiner* — Hoai-An D. Nguyen
(74) *Attorney, Agent, or Firm* — MATTINGLY & MALUR, PC

(57) ABSTRACT

A semiconductor inspection device 1 having a first measurement mode and a second measurement mode includes: an electron optical system configured to irradiate a sample with an electron beam; an optical system configured to irradiate the sample with light; an electron detector configured to detect a signal electron; a photodetector 29 configured to detect signal light; a control unit 11 configured to control the electron optical system and the optical system such that an electron beam and light are emitted under a first irradiation condition in the first measurement mode, and to control the electron optical system and the optical system such that an electron beam and light are emitted under a second irradiation condition in the second measurement (Continued)

mode; and a computer configured to process a detection signal from the electron detector or the photodetector.

19 Claims, 16 Drawing Sheets

(51) Int. Cl.
  *G01R 31/28* (2006.01)
  *G01R 31/307* (2006.01)
(58) Field of Classification Search
  CPC ............ G01R 31/2851; G01R 31/2855; G01R 31/286; G01R 31/2868; G01R 31/302; G01R 31/305; G01R 31/307
  See application file for complete search history.

(56) References Cited

U.S. PATENT DOCUMENTS

| | | | | |
|---|---|---|---|---|
| 6,768,324 B1* | 7/2004 | Yamada | ................ | H01J 37/256 324/754.22 |
| 7,408,643 B2* | 8/2008 | Kimba | .................... | H01J 37/29 356/401 |
| 2002/0093648 A1 | 7/2002 | Nikoonahad et al. | | |
| 2005/0045821 A1 | 3/2005 | Noji et al. | | |
| 2007/0215802 A1 | 9/2007 | Ward et al. | | |
| 2010/0231253 A1* | 9/2010 | Kitagawa | ......... | G01N 21/95607 324/97 |
| 2017/0062180 A1 | 3/2017 | Budach et al. | | |
| 2019/0195621 A1 | 6/2019 | Ogawa et al. | | |

FOREIGN PATENT DOCUMENTS

| | | |
|---|---|---|
| JP | 2011-247603 A | 12/2011 |
| JP | 2012-098294 A | 5/2012 |
| JP | 2013-140071 A | 7/2013 |
| JP | 2016-122860 A | 7/2016 |
| JP | 2017-075935 A | 4/2017 |
| JP | 2018-041737 A | 3/2018 |
| TW | 201937130 A | 9/2019 |

OTHER PUBLICATIONS

Taiwanese Office Acton received in corresponding Taiwanese Application No. 110135460 dated Sep. 27, 2022.

* cited by examiner

[FIG. 1]
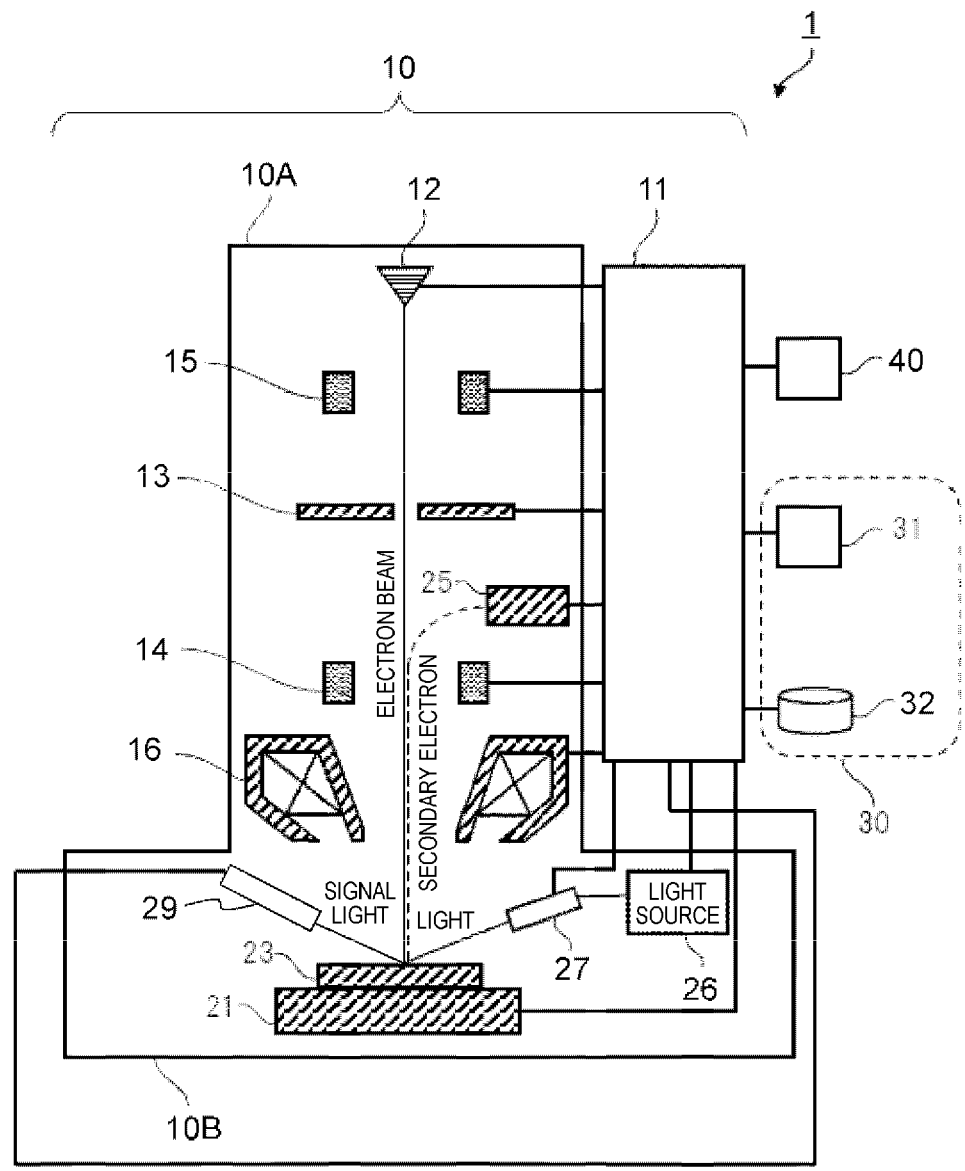

[FIG. 2]
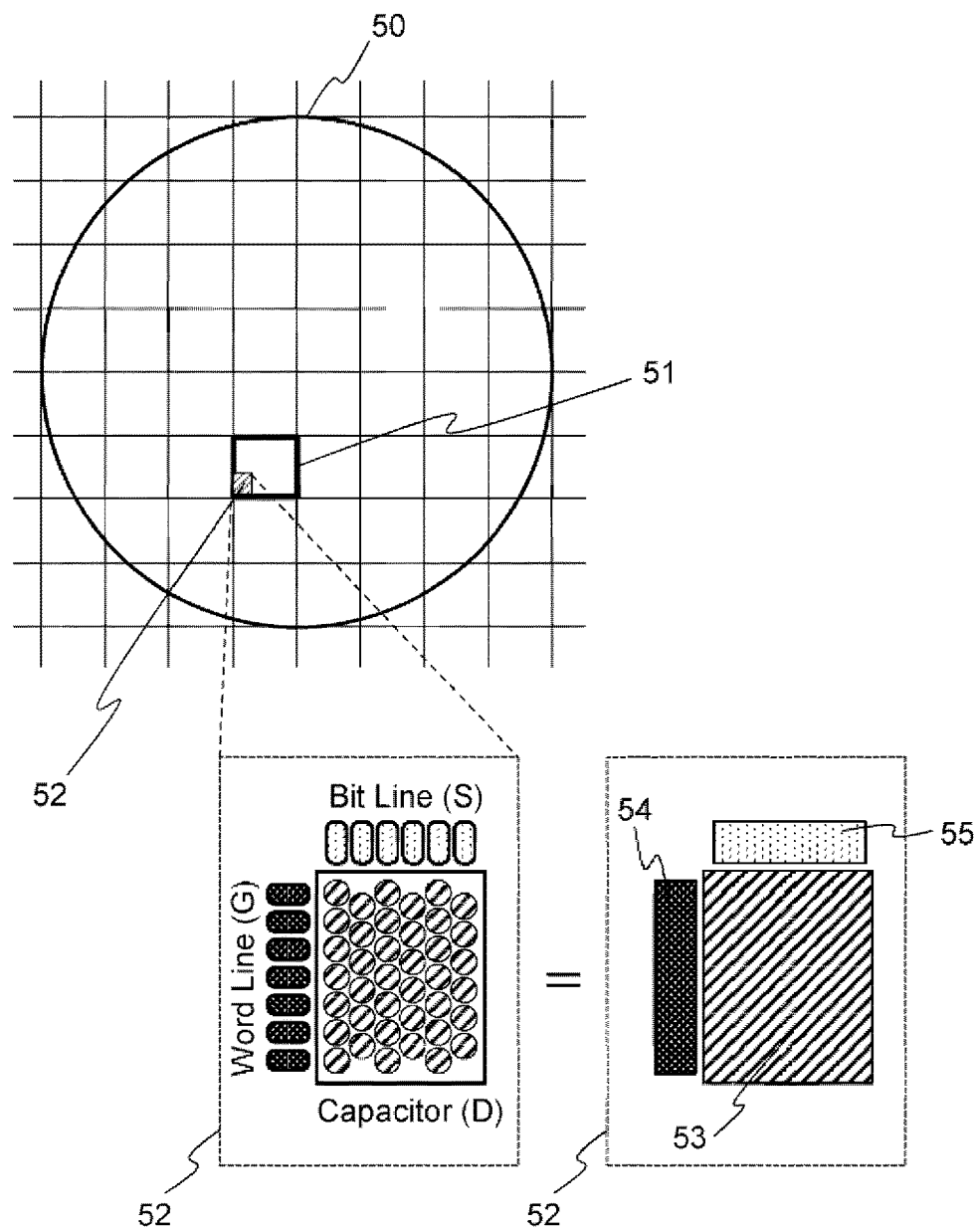
[FIG. 3]
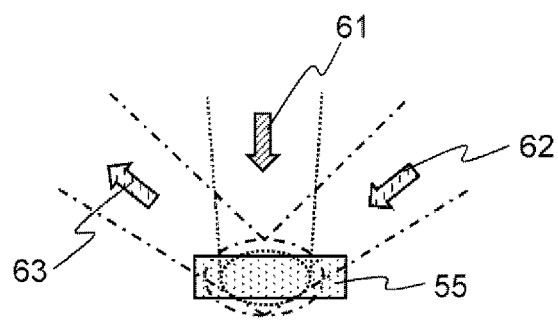

[FIG. 4]
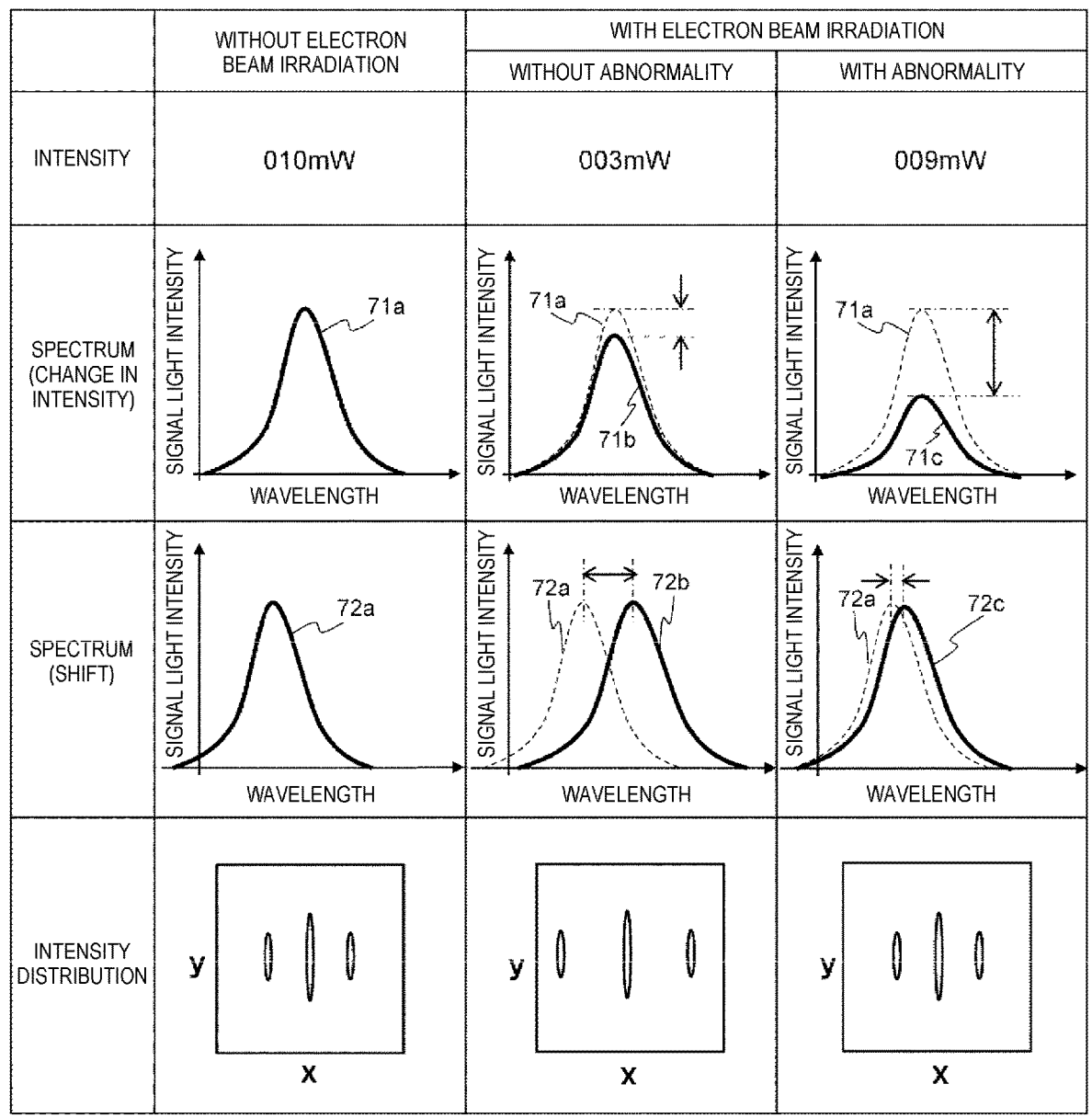

[FIG. 5]
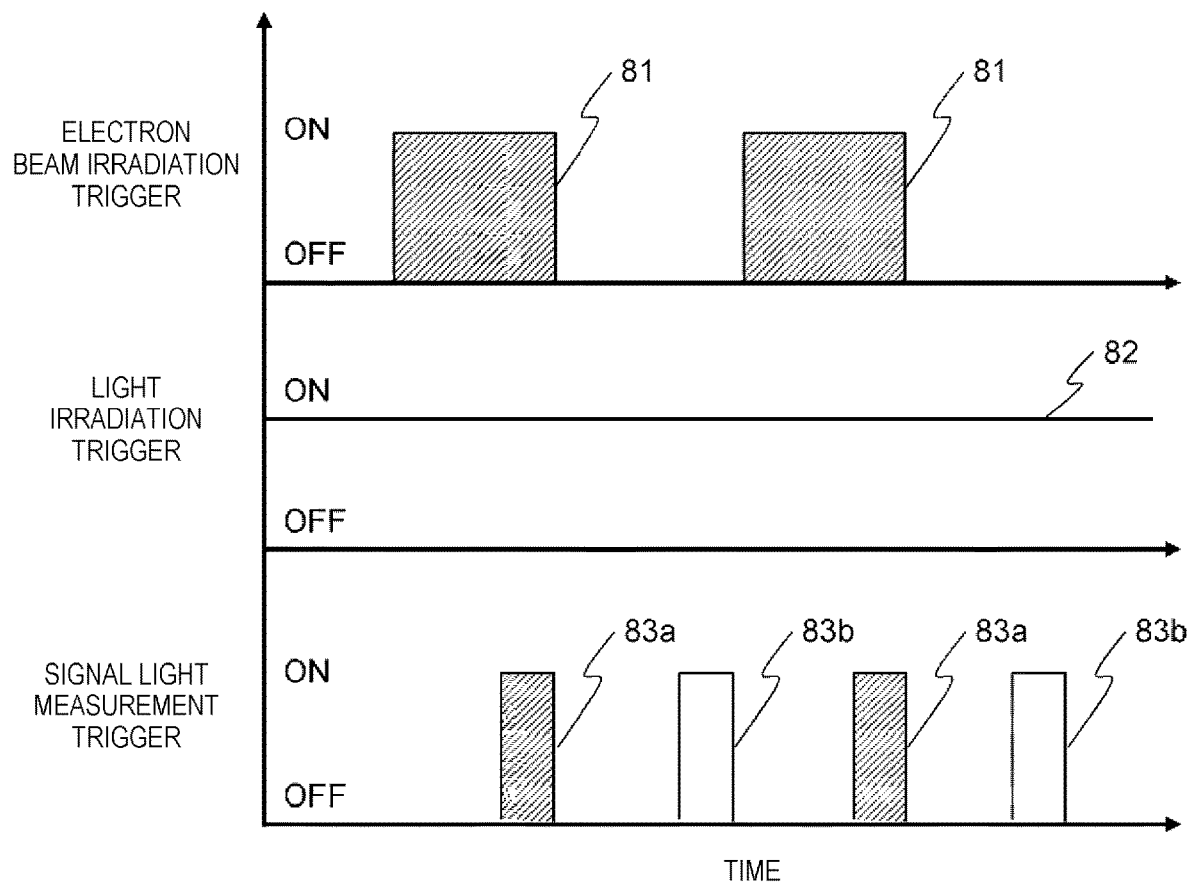
[FIG. 6]
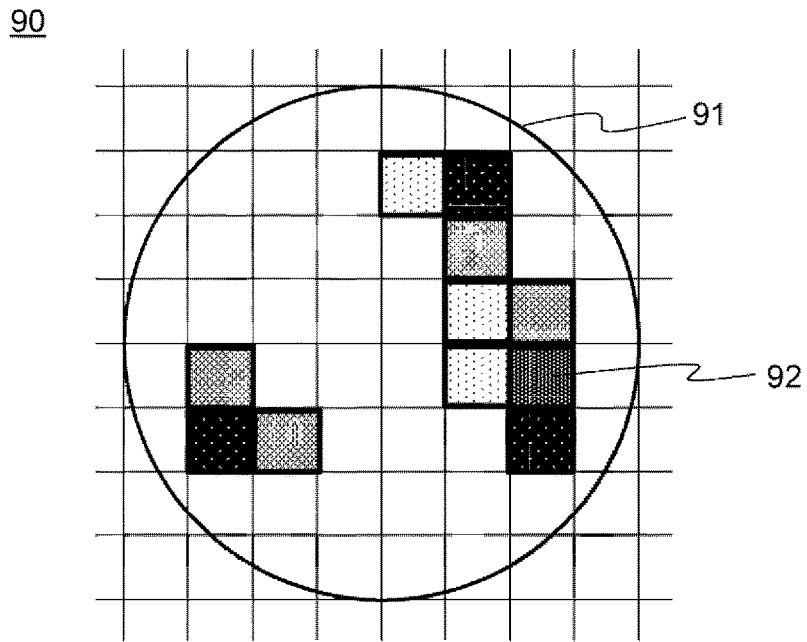

[FIG. 7]
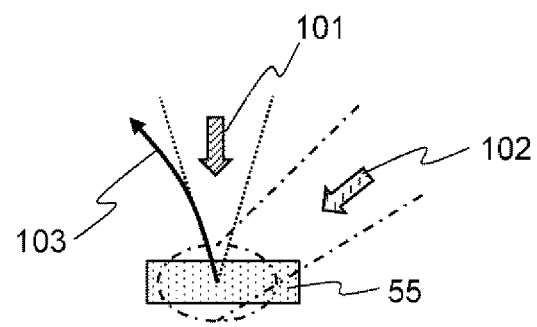

[FIG. 8]
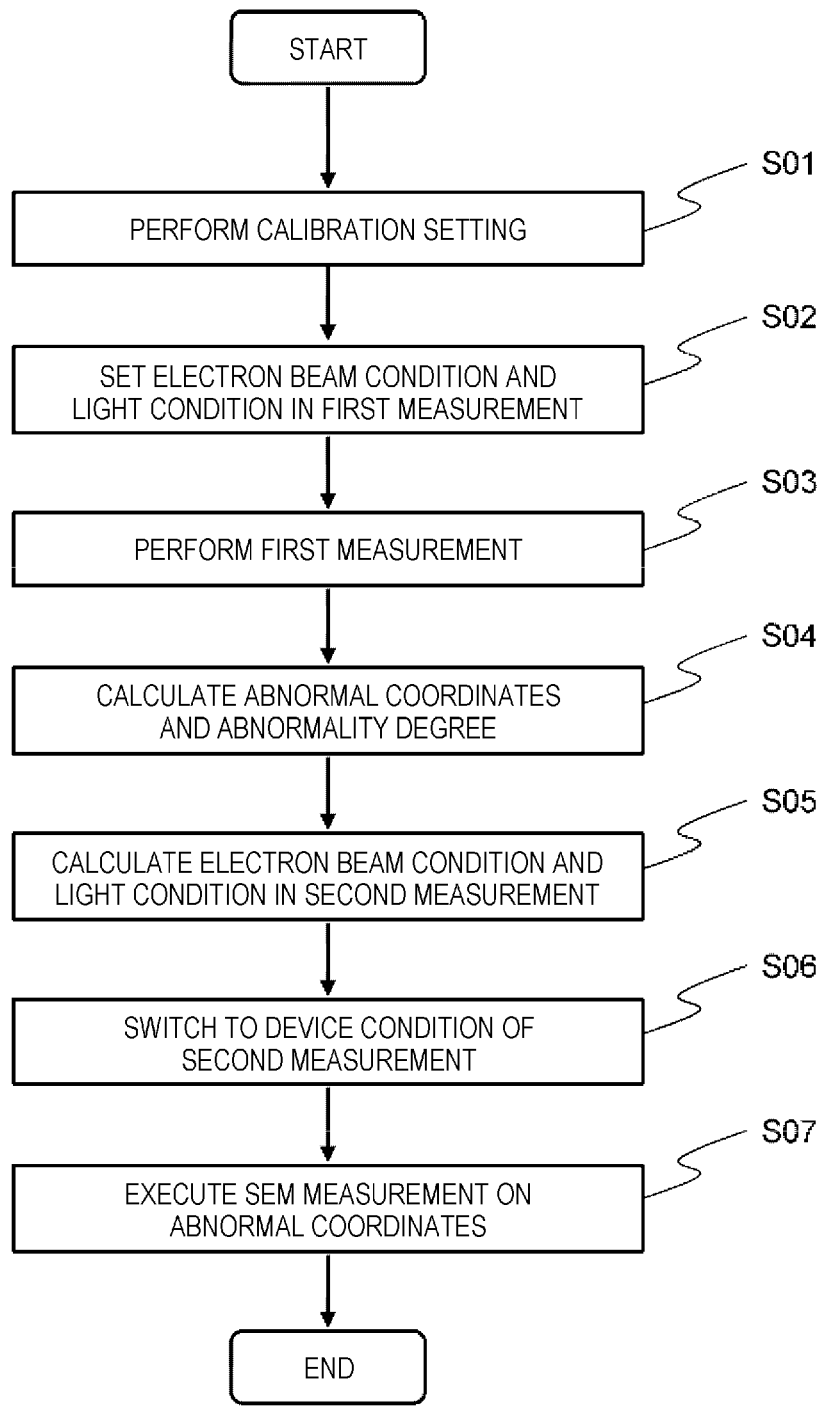

[FIG. 9]
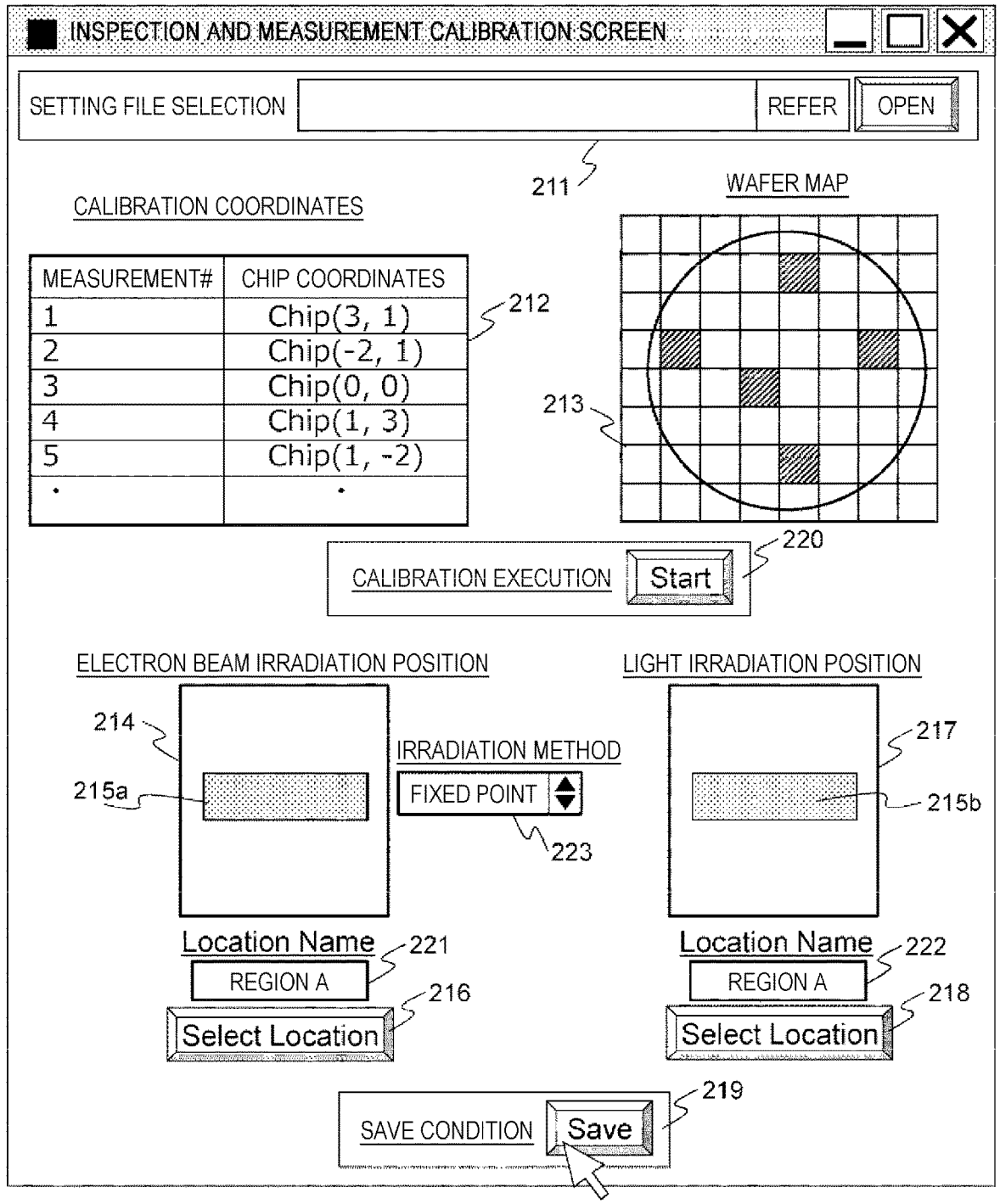

[FIG. 10A]
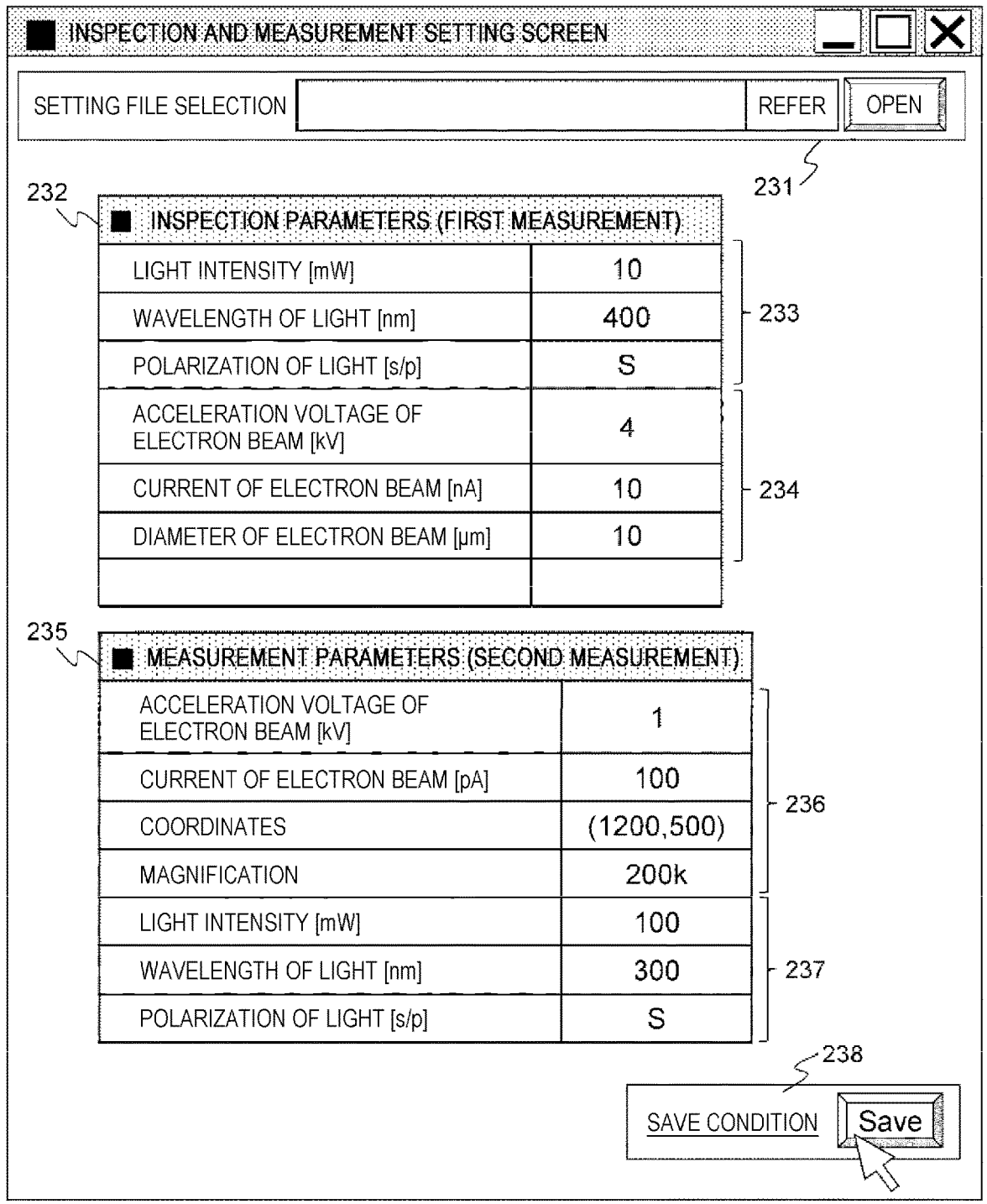

[FIG. 10B]
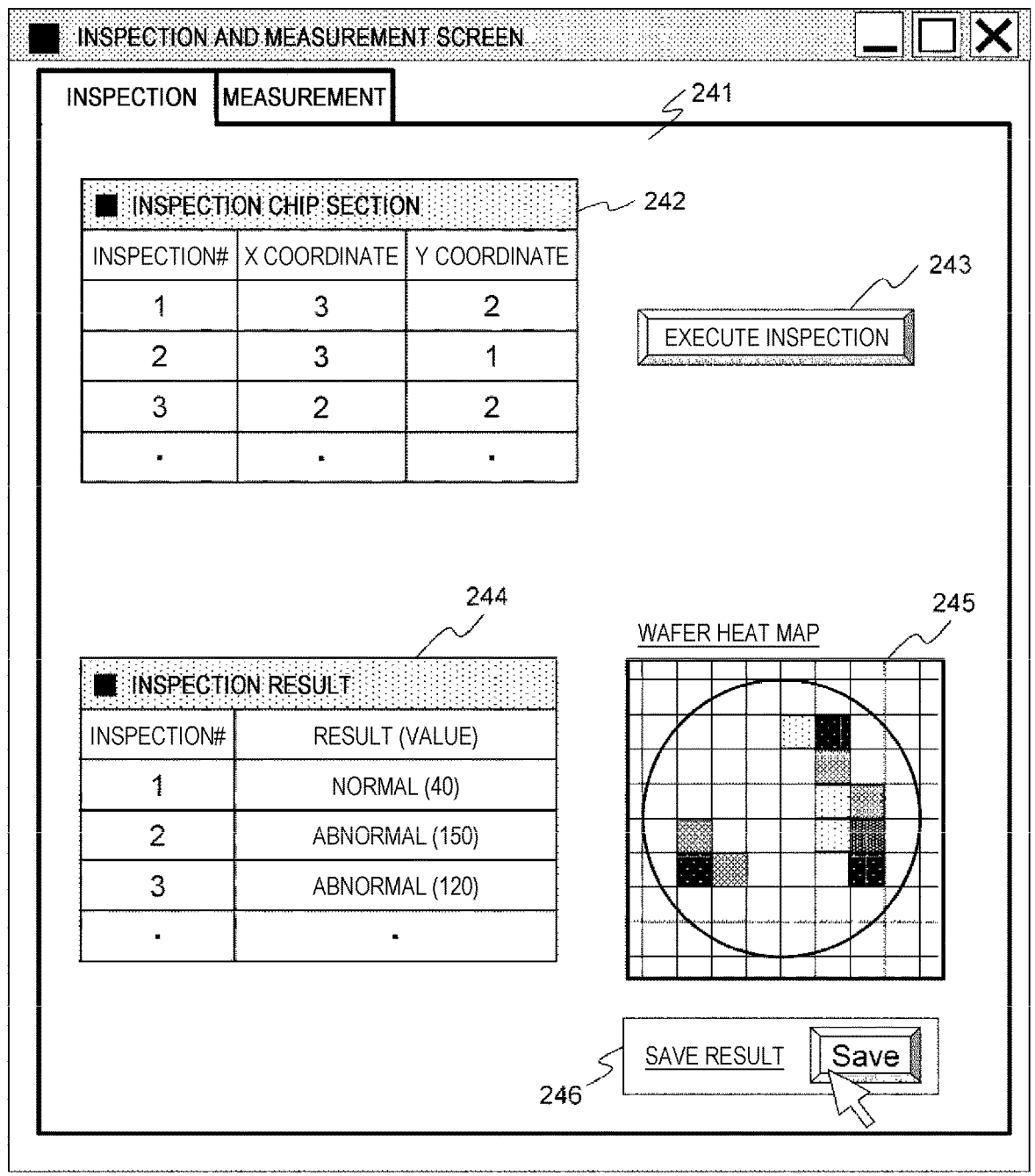

[FIG. 10C]
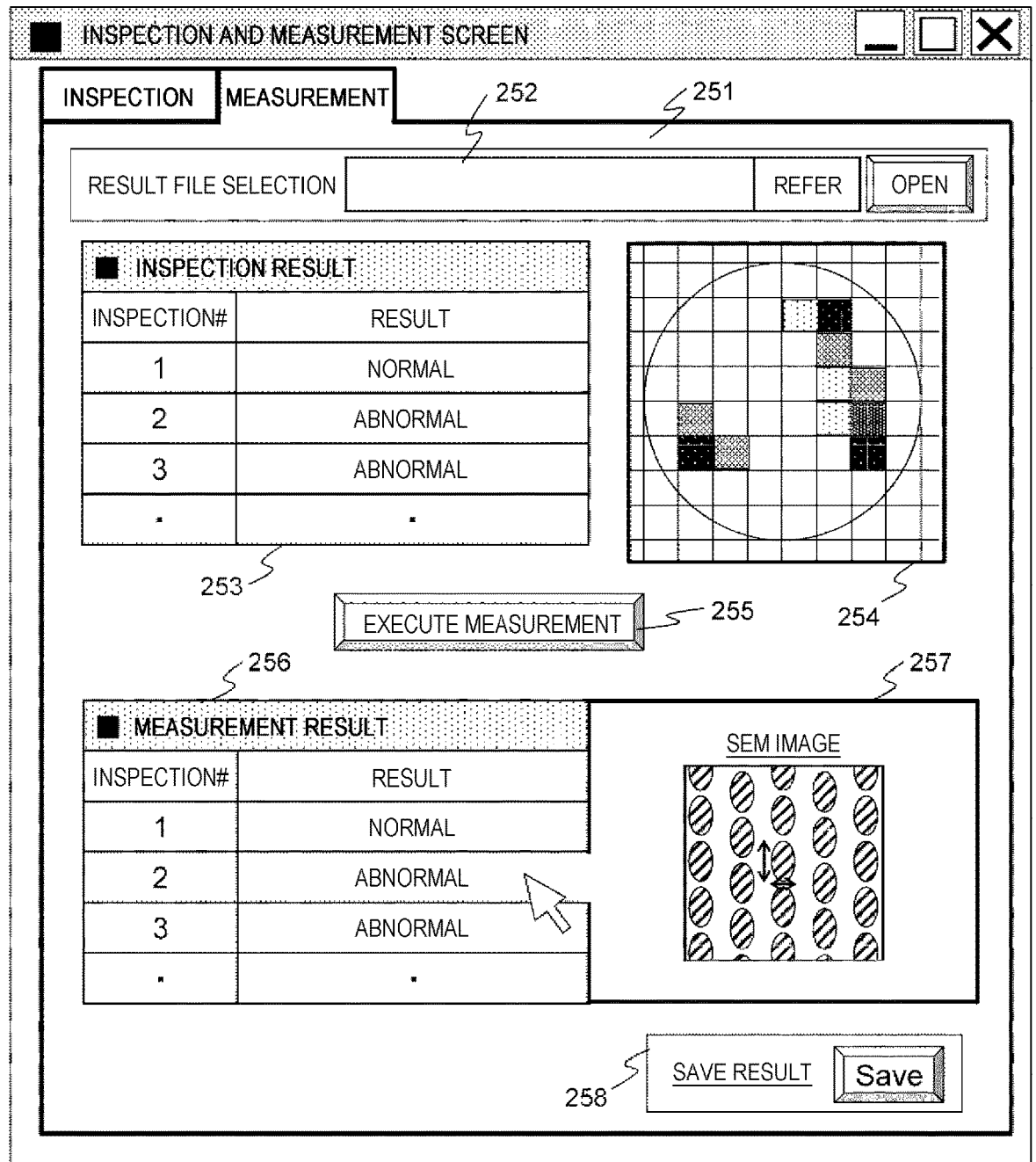

[FIG. 11]
| MATERIAL | ACCELERATION VOLTAGE | ELECTRICAL CHARACTERISTIC | PROBE CURRENT |
|---|---|---|---|
| A1 | B1 | C1 | D1 |
| A1 | B1 | C2 | D2 |
| A1 | B1 | C3 | D3 |
| A1 | B2 | C1 | D4 |
| A1 | B2 | C2 | D5 |
| ⋮ | ⋮ | ⋮ | ⋮ |
[FIG. 12A]
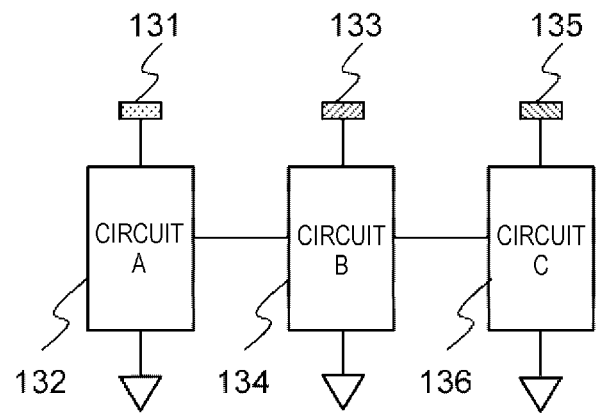

[FIG. 12B]
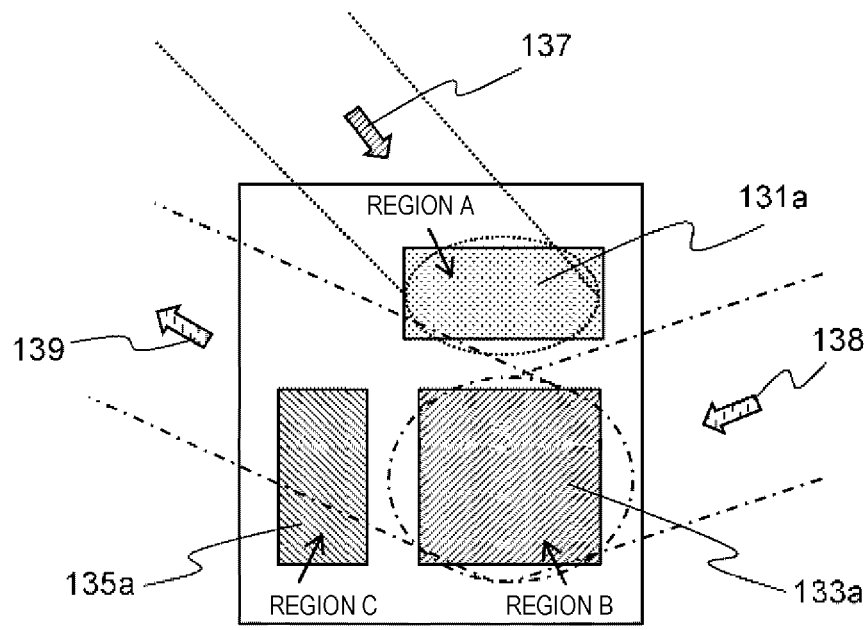
[FIG. 13]
| MEASUREMENT# | CHIP COORDINATES | ELECTRON BEAM IRRADIATION POSITION | LIGHT IRRADIATION POSITION |
|---|---|---|---|
| 1 | Chip(-1, 1) | REGION A (1200, 700) | REGION B (1200, 500) |
| 2 | Chip(-1, 1) | REGION B (1200, 500) | REGION B (1200, 500) |
| 3 | Chip(-1, 1) | REGION C (1000, 500) | REGION B (1200, 500) |
| 4 | Chip(-1, 3) | REGION A (1200, 700) | REGION B (1200, 500) |
| 5 | Chip(-1, 3) | REGION B (1200, 500) | REGION B (1200, 500) |
| ⋮ | ⋮ | ⋮ | ⋮ |

[FIG. 14A]
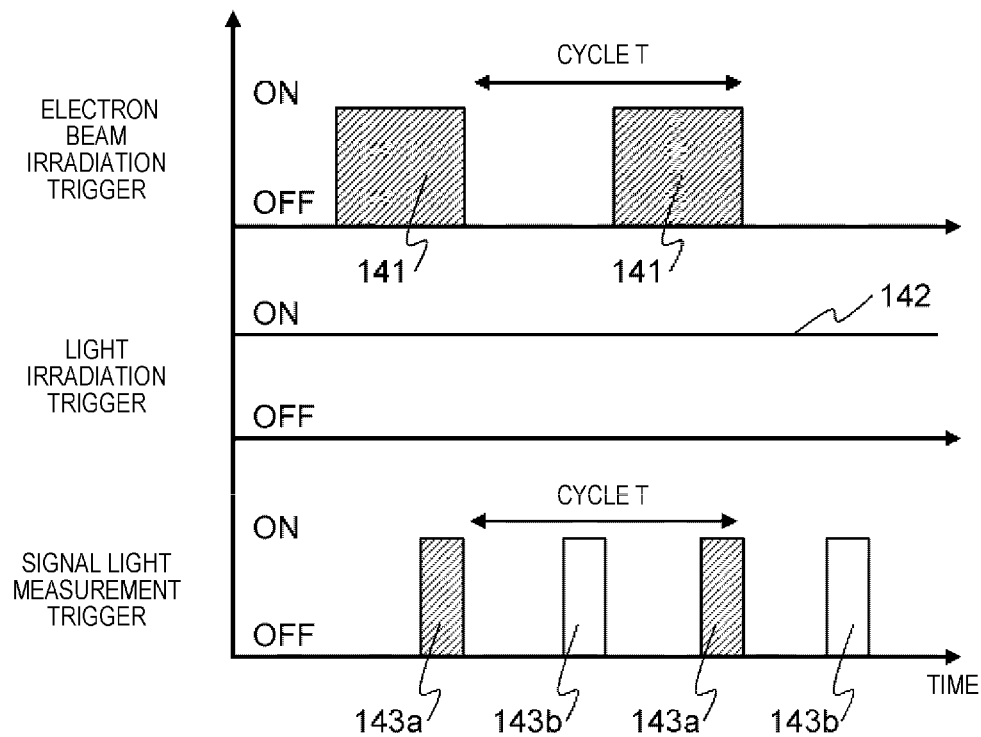
[FIG. 14B]
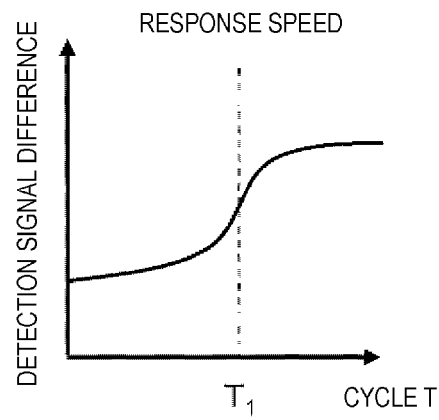

[FIG. 15A]
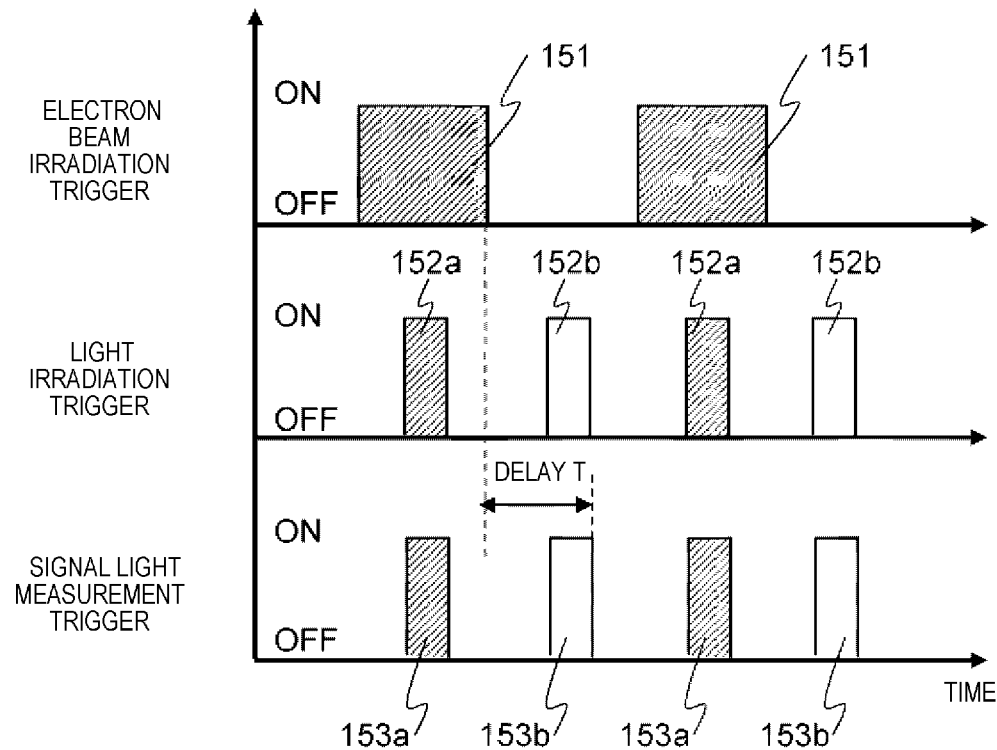
[FIG. 15B]
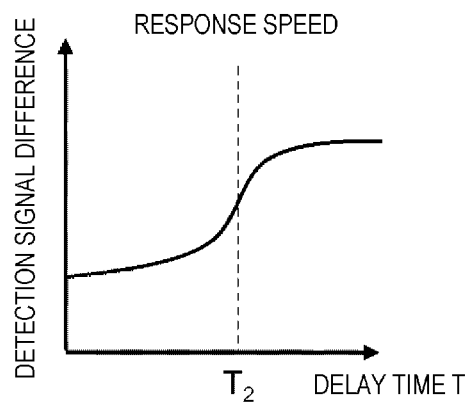

[FIG. 16]
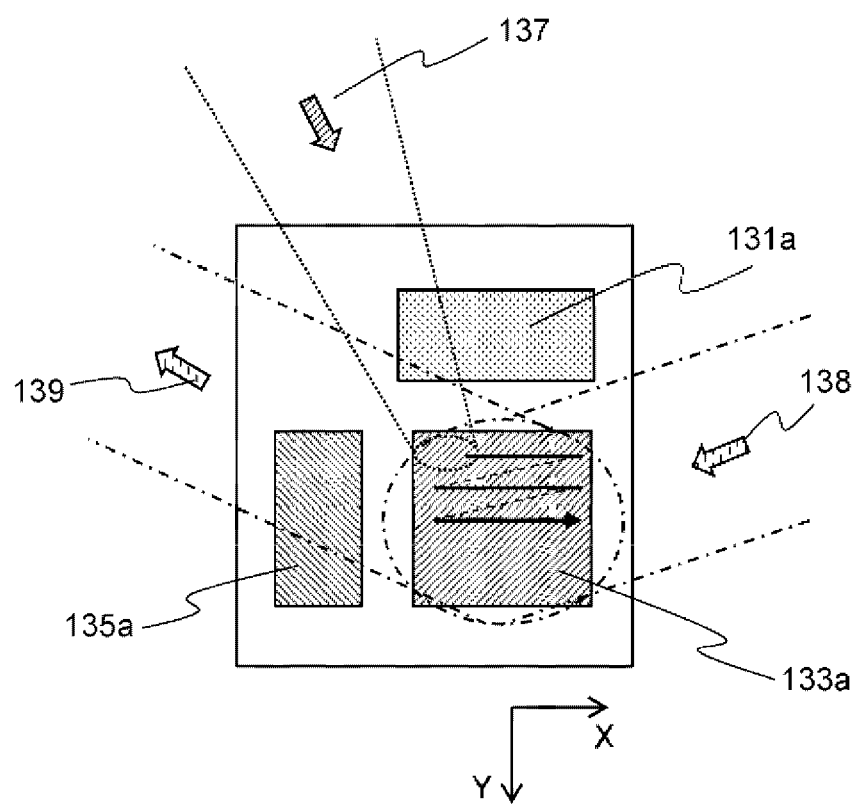

[FIG. 17]
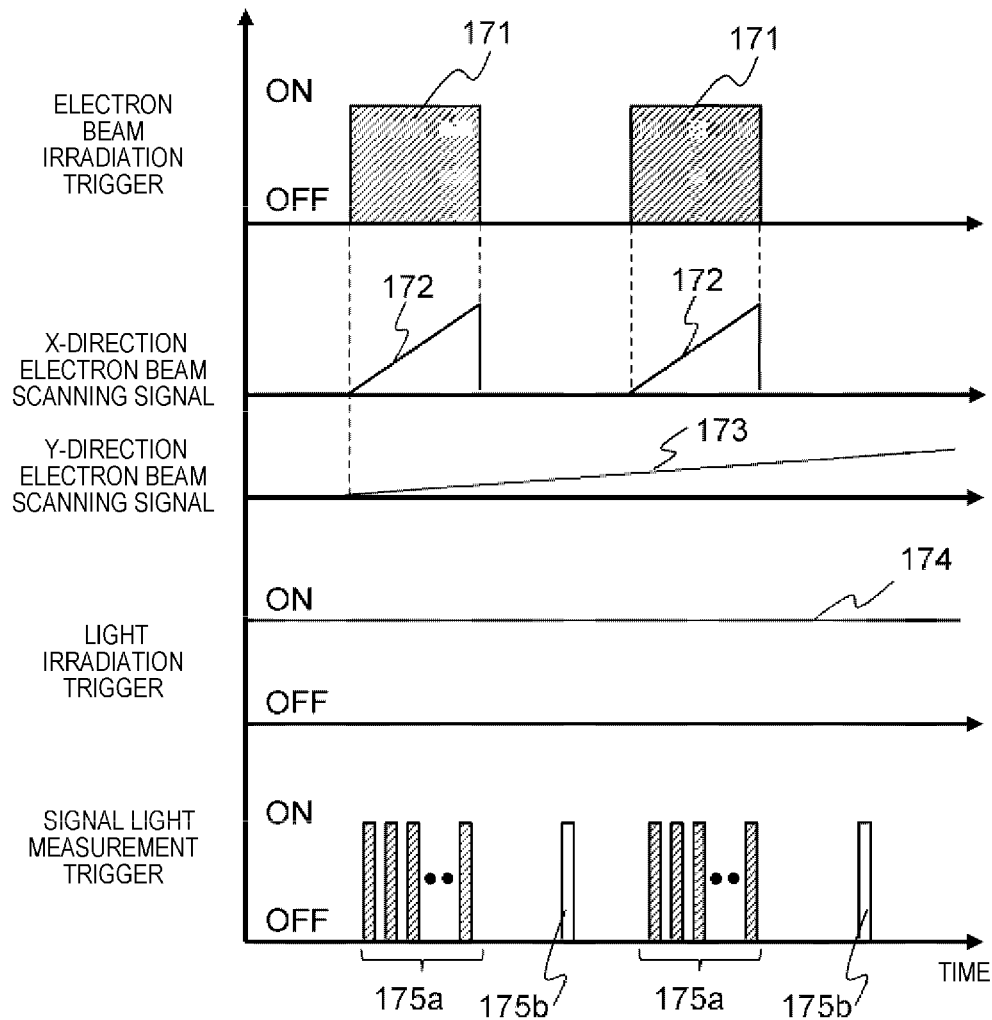
[FIG. 18]
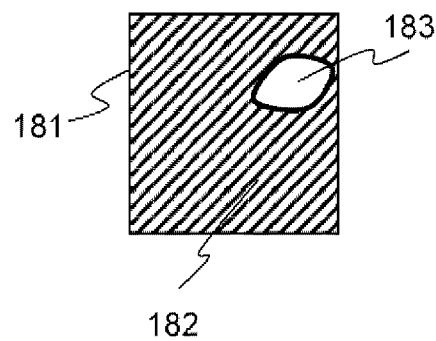

SEMICONDUCTOR INSPECTION DEVICE AND METHOD FOR INSPECTING SEMICONDUCTOR SAMPLE

TECHNICAL FIELD

The present disclosure relates to a semiconductor inspection device and a method for inspecting a semiconductor sample using the semiconductor inspection device.

BACKGROUND ART

PTL 1 discloses a pattern evaluation method and a pattern evaluation system capable of detecting a dimensional variation in an abnormal pattern with respect to an entire surface of a wafer. According to PTL 1, first, an optical inspection device scans the entire surface of the wafer and specifies coordinates on the wafer where there is an abnormality in a pattern dimension by detection light whose light amount is correlated with the pattern. Thereafter, the wafer is transferred to a length measurement scanning electron microscope (SEM), and the pattern dimension is length-measured by the length measurement SEM for a pattern on the wafer whose coordinates are specified by an optical inspection.

CITATION LIST

Patent Literature

PTL 1: JP2013-140071A

SUMMARY OF INVENTION

Technical Problem

In PTL 1, the abnormality detected by the optical inspection device is an abnormality in the pattern dimension. However, a device defect is not only caused by a defect in the pattern dimension, but also caused by an electrical characteristic of a device or a material constituting the device.

The present disclosure relates to a semiconductor inspection device capable of performing an optical inspection at high speed on an abnormality caused by an electrical characteristic of a device or a material (first measurement mode) and performing measurement on a region where the abnormality is detected using an electron beam (second measurement mode).

Solution to Problem

A semiconductor inspection device according to an aspect of the present invention is a semiconductor inspection device having a first measurement mode and a second measurement mode. The semiconductor inspection device includes: an electron optical system configured to irradiate a sample with an electron beam; an optical system configured to irradiate the sample with light; an electron detector configured to detect a signal electron generated when the sample is irradiated with an electron beam from the electron optical system; a photodetector configured to detect signal light generated when the sample is irradiated with light from the optical system; a control unit configured to control the electron optical system and the optical system such that an electron beam and light are emitted under a first irradiation condition in the first measurement mode, and to control the electron optical system and the optical system such that an electron beam and light are emitted under a second irradiation condition in the second measurement mode; and a computer configured to process a detection signal from the electron detector or the photodetector, in which a detection signal from the photodetector is input to the computer in the first measurement mode, and a detection signal from the electron detector is input to the computer in the second measurement mode.

A method for inspecting a semiconductor sample according to an aspect of the invention is a method for inspecting a semiconductor sample using a semiconductor inspection device having a first measurement mode and a second measurement mode, in which the semiconductor inspection device includes an electron optical system configured to irradiate the semiconductor sample with an electron beam, an optical system configured to irradiate the semiconductor sample with light, an electron detector configured to detect a signal electron generated when the semiconductor sample is irradiated with an electron beam from the electron optical system, and a photodetector configured to detect signal light generated when the semiconductor sample is irradiated with light from the optical system. The method for inspecting a semiconductor sample includes:

a first measurement step of irradiating the semiconductor sample with an electron beam from the electron optical system and light from the optical system under a first irradiation condition, and evaluating an electrical characteristic of the semiconductor sample based on a detection signal from the photodetector;

a switching step of switching the electron optical system and the optical system from the first irradiation condition to a second irradiation condition when an abnormality is detected in the first measurement step; and a second measurement step of irradiating the semiconductor sample with an electron beam from the electron optical system and light from the optical system under the second irradiation condition, and forming an image of the semiconductor sample based on a detection signal from the electron detector.

Advantageous Effects of Invention

It is possible to implement a semiconductor inspection device which is capable of performing an inspection of an electrical characteristic and a detailed inspection when an abnormality in the electrical characteristic is detected.

Other technical problems and novel characteristics will be apparent from description of the present description and the accompanying drawings.

BRIEF DESCRIPTION OF DRAWINGS

FIG. 1 is a schematic configuration diagram of a semiconductor inspection device.

FIG. 2 is an example of a sample to be inspected.

FIG. 3 is a diagram showing a state in which an inspection region is irradiated with an electron beam and light in an optical inspection (first measurement mode).

FIG. 4 is an example of an inspection specification of the optical inspection.

FIG. 5 is a time chart of electron beam irradiation, light irradiation, and signal light detection in the optical inspection.

FIG. 6 is a display example of a result of the optical inspection.

FIG. 7 is a diagram showing a state in which the inspection region is irradiated with an electron beam and light in SEM measurement (second measurement mode).

FIG. 8 is a flowchart of measurement in the semiconductor inspection device.

FIG. 9 is an example of an inspection and measurement calibration screen.

FIG. 10A is an example of an inspection and measurement setting screen.

FIG. 10B is an example of an inspection and measurement screen.

FIG. 10C is an example of the inspection and measurement screen.

FIG. 11 is an example of a database.

FIG. 12A shows an example of circuits of a device to be inspected.

FIG. 12B is a diagram showing a layout of the device on which the circuits in FIG. 12A are mounted.

FIG. 13 is an example of setting electron beam irradiation positions and light irradiation positions in a first modification.

FIG. 14A is a time chart of electron beam irradiation, light irradiation, and signal light detection in an optical inspection of a second modification.

FIG. 14B is a diagram showing a change in a detection signal difference depending on a cycle T.

FIG. 15A is a time chart of electron beam irradiation, light irradiation, and signal light detection in an optical inspection of the second modification.

FIG. 15B is a diagram showing a change in the detection signal difference depending on a delay time T.

FIG. 16 is a diagram showing a state in which an inspection region is irradiated with an electron beam and light in optical inspections (first measurement mode) of fourth and fifth modifications.

FIG. 17 is a time chart of electron beam irradiation, electron beam scanning, light irradiation, and signal light detection in the optical inspection of the fifth modification.

FIG. 18 is an image (schematic diagram) obtained by the optical inspection according to the fifth modification.

DESCRIPTION OF EMBODIMENTS

Hereinafter, an embodiment of the invention will be described. Although the drawings shown in the present embodiment show the specific embodiment of the invention, the drawings are for the purpose of understanding the invention, and are in no way to be used for limiting interpretation of the invention.

In a semiconductor inspection device according to the present embodiment, an electrical characteristic of a device or a material constituting the device is evaluated by an optical inspection. Therefore, a mechanism is provided for controlling an electric charge in a sample to be inspected and changing an electrical state of the sample. Since an optical characteristic of the sample also changes when the electrical state of the sample changes, it is possible to detect an abnormality in the electrical characteristic of the device or the material by grasping a change in the optical characteristic when the electrical state of the sample is changed. Specifically, in order to change the electrical state of the sample, the sample is irradiated with an electron beam.

Here, the term "electrical state" is used to broadly refer to a state of a sample, such as a potential, charge, or an electronic state, brought about by fluctuations in the electric charge in the sample due to irradiation on the sample with the electron beam. For example, when a semiconductor film made of Si or the like is irradiated with an electron beam, an electronic state of the semiconductor film changes. Since a semiconductor with a change in an electronic state also has a change in an optical characteristic, for example, a change in the electronic state of the semiconductor can be estimated based on a change in optical reflectance. A field of view for an optical inspection does not need to be made of a uniform material, and may include a device structure made of different materials. For example, when a plug (conductor) disposed in an insulating film is irradiated with an electron beam, the plug is charged and a potential of the plug generates an electric field around the plug (nm to μm), so that it is possible to inspect the electrical characteristic based on the optical characteristic of the sample in this range.

FIG. 1 shows a schematic configuration of a semiconductor inspection device 1 according to the present embodiment. The semiconductor inspection device 1 includes an electron beam device 10, a computer 30, and an input and output device 40 including a display, a keyboard, operation buttons, and the like.

The electron beam device 10 is provided with a lens barrel 10A which embeds an electron optical system which generates an electron beam to be emitted to a sample 23 to be inspected in a sample chamber 10B in which the sample 23 is accommodated, and a control unit 11 is disposed outside the lens barrel 10A and sample chamber 10B. In the lens barrel 10A, an electron source 12, a blanker 15 which pulses an electron beam, an aperture 13 which adjusts a current amount of electron beam irradiation, a deflector 14 which controls a trajectory of the electron beam, an objective lens 16 which focuses the electron beam on a sample surface, and the like are accommodated. These are examples of optical elements constituting the electron optical system, and the electron optical system also includes a condenser lens, a beam separator, and the like.

In the lens barrel 10A, an electron detector 25 which detects a secondary electron emitted from the sample 23 by electron beam irradiation and outputs a detection signal based on the secondary electron is accommodated. The detection signal from the electron detector 25 is used for generation of a scanning electron microscopy (SEM) image, measurement of a size of the sample 23, measurement of the electrical characteristic, and the like. Although the electron detector 25 which detects the secondary electron is shown here, an electron detector which detects a reflection electron (backscattered electron (BSE)) may be provided, or both of the electron detectors may be provided.

A stage 21, the sample 23, and the like are accommodated in the sample chamber 10B. The sample 23 is placed on the stage 21. The sample 23 is, for example, a semiconductor wafer including a plurality of semiconductor devices, or an individual semiconductor device. The stage 21 is provided with a stage drive mechanism (not shown), and a stage position is controlled by the control unit 11 according to an observation field of view.

A light source 26, a light adjuster 27, and a photodetector 29 are disposed in the sample chamber 10B. The light source 26 provides light to irradiate the sample 23, and includes, for example, a solid-state laser, a semiconductor device such as a light emitting diode (LED) or a laser diode (LD), or a white lamp. The light source 26 may include a plurality of types of light sources having different wavelengths. The light adjuster 27 is a functional block which adjusts an optical path of light such that the light emitted from the light source 26 is emitted to a predetermined region of the sample 23. The light adjuster 27 preferably further has a function of modulating an intensity, polarization, and the like of the light emitted from the light source 26. Signal light generated by the light with which the sample 23 is irradiated is detected by the photodetector 29. The signal light to be detected includes reflected light, scattered light, diffracted light, and emitted light. According to the signal light to be detected, a photodetector 29 suitable for the detection can be used. A detection signal from the photodetector 29 is used to evaluate an electrical characteristic of the sample 23.

The light source 26 and the light adjuster 27 constitute an optical system which irradiates the sample 23 with light for an optical inspection. All or a part of the optical elements constituting the optical system and the photodetector may be disposed outside the sample chamber 10B, and light may be emitted to the sample 23 via a port in the sample chamber 10B, or signal light may be detected by the photodetector 29 disposed outside the sample chamber 10B.

The control unit 11 controls components of the electron beam device 10. The control unit 11 performs operation control over the electron source 12, the blanker 15, the aperture 13, the deflector 14, the objective lens 16, and the like based on observation conditions input from the computer 30. The control unit 11 is implemented by a program executed by a processor such as a CPU. For example, the control unit 11 may include a field-programmable gate array (FPGA) or an application specific integrated circuit (ASIC).

An inspection by the semiconductor inspection device 1, setting of measurement conditions and processing of detection signals obtained by the electron detector 25 and the photodetector 29 of the electron beam device 10 are executed by the computer 30. The computer 30 includes a calculation unit 31 and a storage unit 32. The storage unit 32 stores various databases required for condition setting and processing. The calculation unit 31 controls the electron beam device 10 via the control unit 11 while referring to user input data and databases input from the input and output device 40, processes a detection signal, and displays a result on the input and output device 40.

FIG. 2 shows a wafer (semiconductor sample) 50 as an example of a sample to be inspected. The wafer 50 is divided into mesh-shaped chip sections 51 of the same magnitude so that a large number of chips can be manufactured all at once, and each chip section is formed with the same pattern. After a previous process of forming elements such as transistors and wirings on the wafer 50 is completed, the wafer 50 is separated into chips for each chip section. Patterns of various materials constituting the semiconductor device are formed on the wafer 50. FIG. 2 shows a pattern of one memory array 52 when the chip is a DRAM memory chip. The memory array 52 includes a region 53 in which capacitors are integrated, a region 54 in which word lines are integrated, and a region 55 in which bit lines are integrated. Each region is formed with a pattern formed by materials (insulators, semiconductors, conductors, and the like) for the region. The semiconductor inspection device 1 optically inspects, for each region, an electrical characteristic of a pattern or a semiconductor film formed in the region (first measurement mode).

In FIG. 2, the wafer on which the memory chip is formed is shown as the sample to be inspected, but the sample to be inspected is not limited thereto. As long as the chip has a region in which a pattern made of the same material is formed, the chip may be, for example, a sensor chip or a test pattern (test element group) for inspection. Alternatively, the chip may be a wafer (or a part of the wafer) on which a uniform film having no pattern formed thereon is formed. Since a semiconductor device usually includes a stacked film having a plurality of different materials, when the wafer is inspected in an inline manner, depending on a removal process, materials for regions may be different, and further, materials for the same region may be different even in the same chip section. Depending on an inspection purpose, a region and an inspection specification for each region are determined.

FIG. 3 shows a state in which the region 55 is irradiated with an electron beam 61 and light 62 for an optical inspection (first measurement mode). In the optical inspection, since the electron beam 61 is emitted in order to change an electrical state of the sample, a spot diameter is large so as to be substantially equal to a spot diameter (1 μm to 1 mm) of the emitted light 62. Generated signal light 63 is detected by the photodetector 29.

An example of the inspection specification of the optical inspection will be described with reference to FIG. 4. As described above, the signal light includes reflected light, scattered light, diffracted light, emitted light, and the like, and is selected according to the electrical state to be detected. The scattered light may be generated with a wavelength different from a wavelength of light from the light source, such as Raman scattered light. The wavelength of the light from the light source is not limited. In the optical inspection, presence or absence of an abnormality in an electrical characteristic of the pattern in the field of view is determined by comparing a detection signal from the photodetector when an electron beam is not emitted with a detection signal from the photodetector when an electron beam is emitted. The electrical characteristic is typically resistance, capacitance, a defect, and a carrier density, but is not limited thereto.

When a photodiode or a monochromator is used as the photodetector 29, an intensity of signal light having a specific wavelength can be detected (a first stage (uppermost stage) in FIG. 4). Here, an example is shown that in a case where signal light with an intensity of 010 mW is detected in a state without electron beam irradiation, it is determined that there is no abnormality when signal light with an intensity of 003 mW is detected, and it is determined that there is an abnormality when signal light with an intensity of 009 mW is detected in a state with electron beam irradiation. For example, in a case where the region constitutes a capacitor and an electric charge charged by the electron beam irradiation is lost due to a shape defect, when there is a defect, a signal light intensity in a state without the electron beam irradiation and a signal intensity in a state with the electron beam irradiation are substantially similar, and when there is no defect, a signal light intensity in a state without the electron beam irradiation and a signal intensity in a state with the electron beam irradiation are different depending on charge of the electric charge. Therefore, it is possible to perform abnormality detection based on the signal light intensity.

Signal light used for measurement, parameters to be detected by the photodetector (in addition to the intensity, a spectrum, an intensity distribution and the like described below), and abnormality determination methods based on the parameters are different depending on a material for a region to be inspected and an inspection specification determined according to the electrical characteristic to be detected.

When a spectrometer is used as the photodetector 29, a spectrum of the signal light can be detected (second and third stages in FIG. 4). In the second stage, an example in which an abnormality is detected by a change in a peak intensity of the spectrum is shown. Presence or absence of an abnormality can be detected by comparing a peak intensity of a spectrum 71a in the state without electron beam irradiation with a peak intensity of a spectrum 71b (71c) in the state with electron beam irradiation. In the third stage, an example in which an abnormality is detected by a shift amount of the spectrum is shown. Presence or absence of an abnormality can be detected by a shift amount between a spectrum 72a in the state without electron beam irradiation and a spectrum 72b (72c) in the state with electron beam irradiation.

When a multi-pixel optical sensor such as a CCD or a CMOS sensor is used as the photodetector 29, the intensity distribution of the signal light can be detected (a fourth stage (lowermost stage) in FIG. 4). In the fourth stage, an example in which an abnormality is detected by the intensity distribution of the signal light is shown. In this example, the intensity distribution of the signal light in which diffracted light appears on both sides of zero-order light in an x direction is observed. Presence or absence of an abnormality can be detected based on a characteristic of a two-dimensional pattern of the intensity distribution of the signal light, such as a magnitude of the diffracted light or a distance between the zero-order light and the diffracted light. The intensity distribution of the signal light to be detected may be an optical microscope image of the sample. In this case, a sample surface may be projected onto the multi-pixel optical sensor by an optical lens.

Instead of comparing a detection signal from the photodetector when the electron beam is not emitted with a detection signal from the photodetector when the electron beam is emitted, a difference between the detection signal when the electron beam is not emitted and the detection signal when the electron beam is emitted may be detected, and presence or absence of an abnormality may be determined based on a magnitude of the difference.

FIG. 5 shows a time chart of electron beam irradiation, light irradiation, and signal light detection in an optical inspection. An electron beam irradiation trigger 81 is a control signal from the control unit 11 to the blanker 15, and indicates an irradiation period of the electron beam to the sample 23. A cycle of the electron beam irradiation trigger 81 is on the order of Hz to MHz. A light irradiation trigger 82 is a control signal from the control unit 11 to the light source 26 or to the light adjuster 27, and indicates an irradiation period of light to the sample 23. In this example, irradiation light is continuous light. A signal light measurement trigger 83 is a control signal from the control unit 11 to the photodetector 29, and indicates a detection period of signal light. The signal light measurement trigger 83 and the electron beam irradiation trigger 81 are synchronized with each other. It is possible to perform measurement in a state with electron beam irradiation by a signal light measurement trigger 83a which is ON during a period in which the electron beam irradiation trigger 81 is ON, and to perform measurement in a state without electron beam irradiation by a signal light measurement trigger 83b which is ON during a period in which the electron beam irradiation trigger 81 is OFF. In order to improve an SN ratio of the measurement, it is effective to measure a measurement value a plurality of times and take an average value thereof. When the difference between a state in which the electron beam is not emitted and a state in which the electron beam is emitted is taken, accuracy can be improved by performing lock-in detection using a lock-in amplifier.

FIG. 6 shows a display example of a result of the optical inspection. The optical inspection is performed on a user-designated region in a user-designated chip section 51 on the wafer 50. The optical inspection may be performed on all chip sections on the wafer 50. When an electrical characteristic or an optical characteristic of a pattern in the region where the optical inspection is performed is out of an allowable range set by the user, it is determined that there is an abnormality, and is displayed as a wafer heat map 90 based on coordinates of a chip section determined to have the abnormality and a degree of deviation from the allowable range (abnormality degree) of the chip section. In the wafer heat map 90, a chip section 92 is displayed in a wafer 91, and a chip section determined to have the abnormality is displayed with a color corresponding to the abnormality degree, so that the chip section determined to have the abnormality and the abnormality degree thereof are displayed so as to be visually recognizable to the user. The user executes SEM measurement (second measurement mode) using an electron beam on the chip section determined to have the abnormality. In the SEM measurement, the user sets a specification of the SEM measurement by the electron beam based on the abnormality degree thereof.

FIG. 7 shows a state in which the region 55 is irradiated with an electron beam 101 and light 102 for the SEM measurement (second measurement mode). If only dimension measurement and shape evaluation for a pattern in the region 55 are performed, irradiation of the light 102 is unnecessary, but if the SEM measurement is performed in a state where an electrical state is controlled, such as a charging state in the pattern of the region 55, the light 102 is emitted to an observation field of view as shown in FIG. 7. In the SEM measurement, a spot diameter of the electron beam 101 is narrowed down to a small size, and the observation field of view is two-dimensionally scanned. A spot diameter of the light 102 is set to a size including the observation field of view two-dimensionally scanned by the electron beam 101. A signal electron 103 generated by irradiation of the electron beam 101 is detected by the electron detector 25, and an SEM image is formed based on a detection signal of the electron detector 25. An electron beam condition (probe size, acceleration voltage, probe current, and the like) and a light condition (wavelength, polarization, intensity, and the like) in the SEM measurement are determined according to the abnormality degree detected in the optical inspection. For example, in a case where the electrical characteristic detected by the optical inspection is resistance, it is possible to optimize the obtained SEM image by reducing the probe current and reducing charging in a case where a high resistance abnormality is detected.

Thus, since electron beam conditions and light conditions to be used in the first measurement mode and the second measurement mode are different, the semiconductor inspection device performs measurement by switching to the corresponding conditions. In a configuration of FIG. 1, the electron source 12 is shared as an electron source for the optical inspection and an electron source for the SEM measurement, but an electron source for the optical inspection or a lens barrel including the electron source may be separately provided.

FIG. 8 shows a measurement flow in which an abnormality in the electrical characteristic of the sample is detected by the optical inspection (first measurement mode) by the semiconductor inspection device 1, and the SEM measurement (second measurement mode) is performed on the region where the abnormality is detected.

First, calibration setting is performed (S01). As shown in FIG. 3, in the optical inspection (first measurement mode), it is necessary to adjust irradiation positions of the light and the electron beam. Therefore, calibration is performed so that the light and the electron beam are emitted at any position on the wafer in a correct positional relation. FIG. 9 shows an example of an inspection and measurement calibration screen 210 which is a graphical user interface (GUI) for performing calibration setting. The inspection and measurement calibration screen 210 is provided with a setting file selection portion 211, and can call calibration data stored in the storage unit 32 in past measurement. For example, a work load of the user can be reduced by utilizing past calibration data in a case where an inspection is performed on the same wafer with different electrical characteristics to be detected or in a case where the inspection is performed on the same wafer with different inspection regions.

The user selects several chip sections on the wafer for calibration. A chip section for calibration may be directly designated in a calibration coordinate list 212, or may be designated on a wafer map 213 displayed on the screen. By pressing a calibration execution button 220 to execute alignment of the wafer, it is possible to irradiate any position on the wafer with light and an electron beam.

Subsequently, the user sets a region to be inspected in the chip section to be inspected. An SEM image of the chip section is displayed in an electron beam irradiation position image 214, and the user adjusts an observation field of view so that an inspection region 215 is at a center of the SEM image. There are a plurality of electron beam irradiation methods, and a method selection is made from a selection frame 223. FIG. 9 shows an example in which a method of fixed point irradiation of the sample with the electron beam shown in FIG. 3 is selected, but a scanning method or the like as described in a modification to be described later can be selected. By inputting a coordinate name of the inspection region 215a to an input frame 221 and pressing a selection button 216, an irradiation position is determined, and coordinates of the irradiation position are registered. The user can register a plurality of electron beam irradiation positions by displaying another region in the electron beam irradiation position image 214. Similarly, with respect to setting of light irradiation position, a light irradiation position image 217, which is an SEM image of the chip section, is displayed, and the light irradiation position is registered by inputting a coordinate name of an inspection region 215b to an input frame 222, and then pressing a selection button 218. In FIG. 3, the light and the electron beam are set to the same irradiation position, but it is also possible to inspect the electrical characteristic of the device by emitting the light and the electron beam to different positions as in a modification described later. Therefore, an electron beam irradiation position and a light irradiation position can be set independently. A method for setting the irradiation position shown in FIG. 9 is an example. For example, a low-magnification SEM image or an optical microscope image may be displayed in the electron beam irradiation position image 214 or the light irradiation position image 217, and one or more irradiation positions may be designated on the SEM image or the optical microscope image. When the above setting is completed, a save button 219 is pressed to save set contents in the storage unit 32.

Subsequently, the electron beam condition and the light condition of the optical inspection (first measurement mode) are set (S02). FIG. 10A shows an example of an inspection and measurement setting screen 230 which is a GUI for performing condition setting. Similarly to the inspection and measurement calibration screen 210, a setting file selection portion 231 is provided, and inspection and measurement condition data stored in the storage unit 32 in past measurement can be called. The user sets an irradiation condition (first irradiation condition) in a light condition parameter column 233 and an electron beam condition parameter column 234 of an inspection parameter column 232.

The condition setting of the optical inspection in steps S01 and S02 is ended, and the optical inspection (first measurement) is performed according to the set condition (S03). FIG. 10B shows an example of an operation screen (inspection and measurement screen) 240 for executing the optical inspection. An inspection and measurement screen 240a shown in FIG. 10B shows a state in which a first tab 241 including an operation screen and a result display screen of the optical inspection is opened. An upper half of the first tab 241 is an operation screen, and the user designates a chip section to be inspected in an inspection chip section designation portion 242. It is also possible to designate all chip sections on the wafer. Thereafter, by pressing an inspection execution button 243, an optical inspection is executed on the designated chip section.

In the optical inspection, presence or absence of an abnormality in the designated chip section is determined, and an abnormality degree is calculated for at least coordinates (chip section) determined to be abnormal (S04). For example, a relation between the optical characteristic to be measured and an electrical characteristic of a measurement region may be stored in the storage unit 32 as a database and used for abnormality determination. For example, an amount of spectrum shift and a magnitude of a resistance value or a magnitude of a defect density are stored in a database, and the electrical characteristic such as a resistance value and a defect are obtained based on a measured amount of spectrum shift to determine the presence or absence of abnormality. Alternatively, the presence or absence of abnormality may be directly determined based on an optical characteristic of a semiconductor material such as a measured band gap and refractive index. A lower half of the first tab 241 on the inspection and measurement screen 240a shown in FIG. 10B is the result display screen. An inspection result of the chip section designated by the inspection chip section designation portion 242 is displayed on an inspection result display portion 244. This example shows an example in which electrical characteristic values are calculated and displayed regardless of whether the chip section is normal or abnormal. A wafer heat map 245 shown in FIG. 6 is also displayed. After checking a result of the optical inspection, the user presses a save button 246 to save the result of the optical inspection in the storage unit 32.

The user sets the electron beam condition and the light condition in second measurement based on the abnormality degree (S05). In the condition setting, the user sets an irradiation condition (second irradiation condition) in an electron beam condition parameter column 236 and a light condition parameter column 237 of a measurement parameter column 235 in the inspection and measurement setting screen 230 (FIG. 10A). The semiconductor inspection device 1 stores default values of measurement parameters to be set according to the abnormality degree or the electrical characteristic detected in the optical inspection in the storage unit 32 as a database in advance. An example of the database is shown in FIG. 11. With a material for the region and under an acceleration voltage to be emitted, an electron beam current amount (probe current amount) used in the second measurement is stored according to the electrical characteristic (resistance value and the like) of the region calculated in the first measurement. The database may include a light condition used for a second measurement condition. The user can easily set appropriate parameters by referring to such a database.

The computer 30 switches a device condition of the electron beam device 10 to an electron beam condition and a light condition of SEM measurement (second measurement mode) set by the user (S06), and executes the SEM measurement on the chip section determined to have an abnormality in the optical inspection (S07). The user performs a detailed analysis on the abnormality detected in the optical inspection based on an SEM image. FIG. 10C shows an example of an operation screen (inspection and measurement screen) 240 for executing the SEM measurement. An inspection and measurement screen 240b shown in FIG. 10C shows a state in which a second tab 251 including an operation screen and a result display screen of the SEM measurement is opened. An upper half of the second tab 251 is an operation screen, and the user calls result data of the optical inspection stored in the storage unit 32 from a result file selection portion 252. Accordingly, an inspection result display portion 253 and the wafer heat map 254 corresponding to the inspection result display portion 244 and the wafer heat map 245 in the first tab 241 (FIG. 10B) are displayed. By pressing a measurement execution button 255, the SEM measurement is executed for the chip section determined to have an abnormality, and an SEM measurement result is displayed in a lower half of the second tab 251 on the inspection and measurement screen 240b. The result display screen includes a measurement result display portion 256. An optical inspection result of the same chip section as that in the inspection result display portion 253 is displayed in the measurement result display portion 256. An SEM image 257 acquired by the SEM measurement is displayed by pointing a record in which an abnormality is detected in the optical inspection with a pointer. The SEM image 257 shown in FIG. 10C is an image of a region in which capacitors of a DRAM memory array shown in FIG. 2 are integrated. A dimension of a pattern is measured based on the SEM image of the chip section determined to have an abnormality in the optical inspection, it is determined that the abnormality is caused by a shape, and the SEM image and the measured dimension are stored as a measurement result. Alternatively, an SEM image is acquired by irradiation with light, it is determined based on a luminance value of the SEM image that the abnormality is caused by some kind of electrical characteristic, and an electrical characteristic value is stored as the measurement result. The SEM measurement result is stored in the storage unit 32 when a save button 258 is pressed.

Although the inspection of the electrical characteristic of the semiconductor device and the material by the semiconductor inspection device according to the present embodiment and a detailed inspection in the case where the abnormality in the electrical characteristic is detected have been described above, executable inspection and measurement are not limited to the above description. Hereinafter, modifications thereof will be described.

(First Modification)

In an example of FIG. 3, the electron beam and the light are emitted at the same irradiation position. In a first modification, an example in which electron beam and light are emitted at different irradiation positions will be described. FIG. 12A shows an example of a circuit of a device to be inspected. A circuit A 132, a circuit B 134, and a circuit C 136 have an external terminal 131, an external terminal 133, and an external terminal 135, respectively. The circuit A 132 is coupled to the circuit B 134, and the circuit B 134 is coupled to the circuit C 136, thereby creating a relation of interdependence between the circuits. FIG. 12B shows a layout of a device on which the circuits in FIG. 12A are mounted. FIG. 12B shows a region A 131a in which a plug (group) corresponding to the external terminal 131 is formed, a region B 133a in which a plug (group) corresponding to the external terminal 133 is formed, and a region C 135a in which a plug (group) corresponding to the external terminal 135 is formed. The circuits A to C are formed in layers positioned below layers shown in FIG. 12B.

In the optical inspection (first measurement mode) of such a device, as shown in FIG. 12B, the region 131a is irradiated with an electron beam 137, the region 133a is irradiated with light 138, and generated signal light 139 is detected. By charging the plug (group) in the region 131a in this manner, an electrical state of the circuit B 134 is indirectly changed, and an electrical characteristic of circuit B 134 is measured in this state. Accordingly, dependency of the electrical characteristic of the circuit B 134 on the circuit A 132 can be grasped.

In this case, in the calibration setting step (S01, see FIG. 8), as shown in FIG. 13, the electron beam irradiation position and the light irradiation position are set at different positions. FIG. 13 shows an example in which a plurality of electron beam irradiation positions are set (irradiation position coordinates of the electron beam and the light in each chip set in an electron beam condition and light condition setting step (S02) in the first measurement are indicated in parentheses), specifically, the electrical characteristic is measured by directly or indirectly changing the electrical state of the circuit B 134 by irradiating the regions A to C with electron beams. Thus, by registering a plurality of electron beam irradiation positions on the inspection and measurement calibration screen 210 in FIG. 9, a plurality of types of inspections can be performed in each chip. Similarly, a plurality of light irradiation positions are registered, and a plurality of inspections in which the light irradiation positions are changed in the chip can be performed.

(Second Modification)

In the time chart shown in FIG. 5, an example has been described in which a timing of the electron beam irradiation and the signal light detection is set to a predetermined constant cycle, and a magnitude of an electrical characteristic detected at the timing is measured in the optical inspection (first measurement mode). However, not only the magnitude of the electrical characteristic at a certain timing, but also a response characteristic of the electrical characteristic of the device, such as an electric charge retention capability of a capacitor, may be desired to be inspected. In such a case, the response characteristic of the electrical characteristic of the device can be measured by varying timings of the electron beam irradiation and the signal light detection.

A time chart in FIG. 14A is similar as the time chart in FIG. 5, and a cycle of an electron beam irradiation trigger 141, and a cycle of a signal light measurement trigger 143a which is ON during a period in which the electron beam irradiation trigger 141 is ON and a signal light measurement trigger 143b which is ON during a period in which the electron beam irradiation trigger 141 is OFF are both T. In the optical inspection (first measurement), a difference between detection signals in a state with electron beam irradiation and in a state without electron beam irradiation is detected while the cycle T is modulated.

FIG. 14B shows a change in a detection signal difference depending on the cycle T. For example, in a cycle Ti in which the detection signal difference greatly changes, it can be determined that the electric charge charged in the device (capacitor) due to the electron beam irradiation in the above example is lost. Thus, the electrical characteristic measured in the optical inspection (first measurement) can include the response characteristic of the electrical characteristic.

FIG. 15A is another time chart of the second modification. In this example, the light source 26 is pulsed light, and a light irradiation trigger 152 and a signal light measurement trigger 153 which control light emission of the light source 26 are synchronized with an electron beam irradiation trigger 151. It is possible to perform measurement in a state with electron beam irradiation by a light irradiation trigger 152a and a signal light measurement trigger 153a which are ON during a period in which the electron beam irradiation trigger 151 is ON, and to perform measurement in a state without electron beam irradiation by a light irradiation trigger 152b and a signal light measurement trigger 153b which are ON during a period in which the electron beam irradiation trigger 151 is OFF. In this example, a difference between the detection signals in the state with electron beam irradiation and the state without electron beam irradiation is detected while the delay time T between a timing at which the electron beam irradiation trigger 151 changes from ON to OFF and a timing at which the signal light measurement trigger 153b changes from ON to OFF is modulated. FIG. 15B shows a change in the detection signal difference depending on the delay time T. Similar to FIG. 14B, the response characteristic of the electrical characteristic can be measured.

(Third Modification)

In the flowchart of FIG. 8, an example is described in which the electron beam condition and the light condition of the optical inspection (first measurement mode) are set by the user directly inputting a value on the inspection and measurement setting screen 230. An optimum condition for the optical inspection varies depending on a structure and material of the sample. Therefore, in a third modification, in order to set the electron beam condition and the light condition of the optical inspection, preliminary measurement is performed on a region where the optical inspection is to be performed, and the electron beam condition and the light condition of the optical inspection are set based on a result of the preliminary measurement.

The preliminary measurement is SEM measurement similar to the second measurement in the present embodiment, and light irradiation may or may not be performed at the same time. For example, a dimension of the device can be calculated by the preliminary measurement, an amount of electric charge required for charging the device can be calculated, and an electron beam current amount in the first measurement can be calculated. Alternatively, a cycle of the electron beam irradiation in the first measurement can be calculated based on a time constant of the device calculated from the result of the preliminary measurement. Alternatively, an acceleration voltage of an electron beam in the first measurement can be calculated by determining whether the electric charge required for charging is positive or negative based on a charging state of the device calculated based on the result of the preliminary measurement.

(Fourth Modification)

In the irradiation of the sample with the electron beam and the light in the optical inspection (first measurement mode) shown in FIG. 3, the irradiation spot diameter of the electron beam 61 on the sample is substantially equal to the spot diameter of the emitted light 62. However, in this case, a region to be irradiated with the electron beam 61 cannot be freely determined. For example, when it is desired to irradiate the region 55 in FIG. 3 with an electron beam in a focusing way, it is difficult to form an irradiation spot of the electron beam 61 having a shape corresponding to the region 55. In a fourth modification, a method for irradiating any region on the sample with the electron beam 61 without being restricted by the spot diameter will be described. An electron beam irradiation method and a light irradiation method in an optical inspection in the fourth modification will be described with reference to FIG. 16. The irradiation method in the present modification is executed by selecting the scanning method in the selection frame 223 for selecting the electron beam irradiation method in the inspection and measurement calibration screen 210 shown in FIG. 9.

FIG. 16 shows, as an example, a state in which the region 133a (circuit B 134) is irradiated with the electron beam 137 and the light 138, and the region 133a is optically inspected with respect to the device shown in FIGS. 12A and 12B. By selecting the scanning method for electron beam irradiation, a spot diameter of the electron beam 137 on the sample is made smaller than a spot diameter of the light 138, and a region set in the electron beam irradiation position image 214 is two-dimensionally scanned with the electron beam 137 by the deflector 14. By setting the electron beam irradiation position in the region 133a and scanning the region with the electron beam, an irradiation region of the electron beam 137 can be set regardless of the spot diameter of the electron beam 137.

Further, a region to be irradiated with the electron beam 61 may be freely set in the electron beam irradiation position image 214 on the inspection and measurement calibration screen 210, and any region scanning method for scanning the set region with the electron beam 61 may be selectable from the selection frame 223. A characteristic of the any region scanning method is that the region to be irradiated with the electron beam 61 can have any shape designated by the user. Scanning of the electron beam 61 is performed during a period in which the electron beam irradiation trigger 81 is ON in FIG. 5. As described above, an electron beam irradiation region in the optical inspection (first measurement mode) can be freely set. In combination with the first modification, the scanning method may be applied for electron beam irradiation to an electron beam irradiation region different from a light irradiation region.

(Fifth Modification)

In the optical inspection (first measurement mode) in the embodiment, inspection of the entire light irradiation region is performed. In other words, the electrical characteristic inspected in the first measurement mode of the embodiment is an average characteristic in the entire light irradiation region. In contrast, in a fifth modification, an optical inspection with excellent spatial resolution is implemented by detecting distribution of electrical characteristics in the light irradiation region. The scanning method described in the fourth modification or any region scanning method is applied to the electron beam irradiation method in the present modification.

An optical inspection of the fifth modification will be described with reference to the example in FIG. 16. It is assumed that the region 133a is irradiated with the light 138, the spot diameter of the electron beam 137 is made smaller than the spot diameter of the light 138, and the region 133a is scanned. A time chart of the fifth modification is shown in FIG. 17. The time chart in FIG. 17 is similar to the time chart in FIG. 5, and an X-direction electron beam scanning signal 172 and a Y-direction electron beam scanning signal 173 are added. The electron beam scanning signals 172 and 173 are control signals from the control unit 11 to the deflector 14, so that the sample is two-dimensionally scanned with the electron beam 137. The X-direction electron beam scanning signal 172 allows the electron beam 137 to perform scanning in an X direction, and the Y-direction electron beam scanning signal 173 allows a scanning position of the electron beam to move in a Y direction orthogonal to the X direction. In the time chart in FIG. 17, scanning in the Y direction is continuously performed, while scanning in the X direction is performed during a period in which an electron beam irradiation trigger 171 is ON, and the region 133a is scanned with the electron beam 137 in a line shape extending in the X direction within the period.

A signal light measurement trigger 175 and the electron beam irradiation trigger 171 are synchronized with each other. It is possible to perform measurement in a state with electron beam irradiation by a signal light measurement trigger 175a which is ON during a period in which the electron beam irradiation trigger 171 is ON, and to perform measurement in a state without electron beam irradiation by a signal light measurement trigger 175b which is ON during a period in which the electron beam irradiation trigger 171 is OFF. Since the X-direction electron beam scanning signal 172 and the Y-direction electron beam scanning signal 173 indicate a position of the electron beam 137 emitted on the sample, imaging can be performed by two-dimensionally arranging detection signals from the photodetector in accordance with the electron beam scanning signals 172 and 173. For example, when the detection signal is an intensity of signal light, a value of a pixel is the intensity of the signal light in a state where the scanning position of the electron beam is irradiated with the electron beam 137 at a timing of the signal light measurement trigger 175a. Since a signal light intensity detected at a timing of the signal light measurement trigger 175b is an intensity in a state without electron beam irradiation, an influence of the electron beam irradiation can be more easily detected by subtracting a signal intensity detected by the signal light measurement trigger 175b as a background from a signal intensity detected by the signal light measurement trigger 175a.

An image (schematic diagram) of the region 133a in FIG. 16 obtained in this manner is shown in FIG. 18. It is assumed that a region 183 in which a signal light intensity is significantly higher than a signal light intensity in a surrounding region 182 is observed in a part of an image 181 of the region 133a. In this case, it can be determined that there is an abnormality in a shape or electrical characteristic of an inspected device or semiconductor film in the region 183. Therefore, coordinates of the abnormal region 183 are stored in the storage unit 32 as a defective portion. SEM measurement, which is the second measurement mode, is performed for the stored coordinates (region 183), and detailed measurement is performed on the electrical characteristic or the shape of the device. A pixel value of the image is not limited to the intensity of the signal light, and may be a numerical value of the amount of spectrum shift or the intensity distribution shown in FIG. 4. Alternatively, the pixel value may be a numerical value of an optical characteristic such as a band gap and a refractive index, and an electrical characteristic such as resistance and a defect density. Thus, the spatial resolution in the optical inspection can be improved.

The invention has been described above with reference to the embodiment and the modifications. The embodiment and modifications described above may be modified in various ways without departing from the scope of the invention, and may be used in combination.

REFERENCE SIGNS LIST

1: semiconductor inspection device
10: electron beam device
10A: lens barrel
10B: sample chamber
11: control unit
12: electron source
13: aperture
14: deflector
15: blanker
16: objective lens
21: stage
23: sample
25: electron detector
26: light source
27: light adjuster
29: photodetector
30: computer
31: calculation unit
32: storage unit
40: input and output device
50: wafer
51: chip section
52: memory array
53 to 55: region
61: electron beam
62: light
63: signal light
71, 72: spectrum
81, 141, 151, 171: electron beam irradiation trigger
82, 142, 152, 174: light irradiation trigger
83, 143, 153, 175: signal light measurement trigger
90: wafer heat map
91: wafer
92: chip section
101: electron beam
102: light
103: signal electron
131, 133, 135: external terminal
132, 134, 136: circuit
137: electron beam
138: light
139: signal light
172: X-direction electron beam scanning signal
173: Y-direction electron beam scanning signal
181: image
182, 183: region
210: inspection and measurement calibration screen
211, 121: setting file selection portion
212: calibration coordinate list
213: wafer map
214: electron beam irradiation position image
215: inspection region
216, 218: selection button
217: light irradiation position image
219, 238, 246, 258: save button
220: calibration execution button
221, 222: input frame
223: selection frame
230: inspection and measurement setting screen
232: inspection parameter column
233, 237: light condition parameter column
234, 236: electron beam condition parameter column
235: measurement parameter column
240: inspection and measurement screen
241: first tab
242: inspection chip section designation portion
243: inspection execution button
244, 253: inspection result display portion
245, 254: wafer heat map 251: second tab
252: result file selection portion
255: measurement execution button
256: measurement result display portion
257: SEM image

The invention claimed is:

1. A semiconductor inspection device having a first measurement mode and a second measurement mode, the semiconductor inspection device comprising:
an electron optical system configured to irradiate a sample with an electron beam;
an optical system configured to irradiate the sample with light;
an electron detector configured to detect a signal electron generated when the sample is irradiated with an electron beam from the electron optical system;
a photodetector configured to detect signal light generated when the sample is irradiated with light from the optical system;
a control unit configured to control the electron optical system and the optical system such that an electron beam and light are emitted under a first irradiation condition in the first measurement mode, and to control the electron optical system and the optical system such that an electron beam and light are emitted under a second irradiation condition in the second measurement mode; and
a computer configured to process a detection signal from the electron detector or the photodetector, wherein
a detection signal from the photodetector is input to the computer in the first measurement mode, and a detection signal from the electron detector is input to the computer in the second measurement mode.

2. The semiconductor inspection device according to claim 1, wherein
in the first measurement mode, the control unit performs control such that a first region of the sample is irradiated with light from the optical system, and the computer evaluates an electrical characteristic of the first region based on a detection signal from the photodetector in a state with electron beam irradiation from the electron optical system and a detection signal from the photodetector in a state without electron beam irradiation from the electron optical system.

3. The semiconductor inspection device according to claim 2, wherein
in the first measurement mode, the control unit performs control such that the first region is irradiated with an electron beam from the electron optical system, and a spot diameter of the electron beam from the electron optical system is set to a size corresponding to a spot diameter of light from the optical system.

4. The semiconductor inspection device according to claim 2, wherein
in the first measurement mode, the control unit performs control such that the first region is irradiated with an electron beam from the electron optical system, and the electron optical system scans the first region with an electron beam having a spot diameter smaller than a spot diameter of light from the optical system.

5. The semiconductor inspection device according to claim 2, wherein
in the first measurement mode, the control unit performs control such that a region different from the first region is irradiated with an electron beam from the electron optical system.

6. The semiconductor inspection device according to claim 5, wherein
the electron optical system scans the region different from the first region with an electron beam having a spot diameter smaller than a spot diameter of light from the optical system.

7. The semiconductor inspection device according to claim 2, wherein
in the second measurement mode, the control unit performs control such that a second region determined based on a measurement result in the first measurement mode is scanned with an electron beam from the electron optical system, and the computer forms an image of the second region based on a detection signal from the electron detector.

8. The semiconductor inspection device according to claim 7, wherein
the computer includes a database indicating a correspondence between an electrical characteristic and the second irradiation condition, and the second irradiation condition is determined with reference to the database based on the electrical characteristic obtained by the computer.

9. The semiconductor inspection device according to claim 2, wherein
light emitted by the optical system is continuous light,
in the first measurement mode, the control unit outputs an electron beam irradiation trigger which causes the electron optical system to emit an electron beam in cycles, and a signal light measurement trigger which causes the photodetector to detect signal light in cycles, and
the electron beam irradiation trigger and the signal light measurement trigger are synchronized with each other, and the signal light measurement trigger includes a first trigger which is ON when the electron beam irradiation trigger is ON and a second trigger which is ON when the electron beam irradiation trigger is OFF.

10. The semiconductor inspection device according to claim 9, wherein
the control unit changes a cycle of the electron beam irradiation trigger and a cycle of the signal light measurement trigger.

11. The semiconductor inspection device according to claim 2, wherein
in the first measurement mode, the control unit outputs an electron beam irradiation trigger which causes the electron optical system to emit an electron beam in cycles, a light irradiation trigger which causes the optical system to emit light in cycles, and a signal light measurement trigger which causes the photodetector to detect signal light in cycles, and
the electron beam irradiation trigger is synchronized with the light irradiation trigger and the signal light measurement trigger, and each of the light irradiation trigger and the signal light measurement trigger includes a first trigger which is ON when the electron beam irradiation trigger is ON and a second trigger which is ON when the electron beam irradiation trigger is OFF.

12. The semiconductor inspection device according to claim 11, wherein
the control unit changes a delay time from the electron beam irradiation trigger to the second trigger of the light irradiation trigger and the second trigger of the signal light measurement trigger.

13. The semiconductor inspection device according to claim 9, wherein
in the first measurement mode, the control unit outputs a first scanning signal which causes the electron optical system to perform scanning with an electron beam in a first direction, and a second scanning signal which causes a scanning position of the electron beam to move in a second direction orthogonal to the first direction,
the electron beam irradiation trigger and the first scanning signal are synchronized with each other, and the electron optical system scans an irradiation region of the electron beam in the first direction during a period in which the electron beam irradiation trigger is ON, and
the computer forms an image based on a detection signal from the photodetector in a state with electron beam irradiation from the electron optical system.

14. The semiconductor inspection device according to claim 13, wherein
the computer determines a pixel value of the image by subtracting a detection signal from the photodetector in a state without electron beam irradiation from the electron optical system as a background from a detection signal from the photodetector in a state with electron beam irradiation from the electron optical system.

15. A method for inspecting a semiconductor sample using a semiconductor inspection device,
the semiconductor inspection device including an electron optical system configured to irradiate the semiconductor sample with an electron beam, an optical system configured to irradiate the semiconductor sample with light, an electron detector configured to detect a signal electron generated when the semiconductor sample is irradiated with an electron beam from the electron optical system, and a photodetector configured to detect signal light generated when the semiconductor sample is irradiated with light from the optical system,
the method for inspecting a semiconductor sample comprising:
a first measurement step of irradiating the semiconductor sample with an electron beam from the electron optical system and light from the optical system under a first irradiation condition, and evaluating an electrical characteristic of the semiconductor sample based on a detection signal from the photodetector;
a switching step of switching the electron optical system and the optical system from the first irradiation condition to a second irradiation condition when an abnormality is detected in the first measurement step; and
a second measurement step of irradiating the semiconductor sample with an electron beam from the electron optical system and light from the optical system under the second irradiation condition, and forming an image of the semiconductor sample based on a detection signal from the electron detector.

16. The method for inspecting a semiconductor sample according to claim 15, wherein
the semiconductor inspection device includes a database indicating a correspondence between an electrical characteristic and the second irradiation condition, and
the second irradiation condition is determined with reference to the database based on the electrical characteristic of the semiconductor sample obtained in the first measurement step.

17. The method for inspecting a semiconductor sample according to claim 15, wherein
the semiconductor sample includes a plurality of chip sections,
the method for inspecting a semiconductor sample further includes a calibration step of setting an irradiation position of an electron beam from the electron optical system and an irradiation position of light from the optical system before the first measurement step, and
in the calibration step, a plurality of chip sections to be calibrated are selected in the semiconductor sample and designations of an electron beam irradiation position and a light irradiation position in the chip section are received, and calibration is executed on the electron optical system and the optical system so that an electron beam and light are emitted to the designated electron beam irradiation position and light irradiation position in each of the selected chip sections.

18. The method for inspecting a semiconductor sample according to claim 15, wherein
in the first measurement step, a first region of the semiconductor sample is irradiated with light from the optical system, and an electrical characteristic of the first region is evaluated based on a detection signal from the photodetector in a state with electron beam irradiation from the electron optical system and a detection signal from the photodetector in a state without electron beam irradiation from the electron optical system.

19. The method for inspecting a semiconductor sample according to claim 15, further comprising:
a preliminary measurement step of forming an image of the semiconductor sample before the first measurement step, wherein
in the preliminary measurement step, the electron optical system and the optical system are controlled so that an electron beam and light are emitted under a third irradiation condition, a predetermined region is scanned with an electron beam from the electron optical system, and an image of the predetermined region is formed based on a detection signal from the electron detector, and
the first irradiation condition is determined based on a measurement result obtained in the preliminary measurement step.

* * * * *